United States Patent
Hsu et al.

(10) Patent No.: US 12,088,267 B2
(45) Date of Patent: Sep. 10, 2024

(54) AUDIO AMPLIFIER WITH DUTY RATIO CONTROL

(71) Applicant: ELITE SEMICONDUCTOR MICROELECTRONICS TECHNOLOGY INC., Hsinchu (TW)

(72) Inventors: Che-Wei Hsu, Hsinchu (TW); Wun-Long Yu, Hsinchu (TW)

(73) Assignee: ELITE SEMICONDUCTOR MICROELECTRONICS TECHNOLOGY INC., Hsinchu (TW)

( * ) Notice: Subject to any disclaimer, the term of this patent is extended or adjusted under 35 U.S.C. 154(b) by 479 days.

(21) Appl. No.: 17/585,606

(22) Filed: Jan. 27, 2022

(65) Prior Publication Data
US 2023/0238932 A1    Jul. 27, 2023

(51) Int. Cl.
*H03F 1/30* (2006.01)
*H02M 3/158* (2006.01)
*H03F 3/217* (2006.01)
*H03G 3/30* (2006.01)

(52) U.S. Cl.
CPC ........ *H03G 3/3015* (2013.01); *H02M 3/1582* (2013.01); *H03F 3/2178* (2013.01); *H03F 2200/351* (2013.01)

(58) Field of Classification Search
CPC ............... H03F 1/30; H03F 3/217; H03F 3/38
USPC ............................ 330/297, 10, 271, 207 A
See application file for complete search history.

(56) References Cited

U.S. PATENT DOCUMENTS

| | | | |
|---|---|---|---|
| 6,812,785 B2 * | 11/2004 | Masuda | H03F 3/2171 330/10 |
| 7,482,865 B2 * | 1/2009 | Kost | H03F 1/30 330/10 |
| 7,554,409 B1 * | 6/2009 | Zhang | H03F 1/523 330/10 |
| 7,965,137 B2 * | 6/2011 | Takagi | H03F 3/217 330/10 |
| 9,473,098 B2 | 10/2016 | Lesso | |
| 9,484,860 B2 | 11/2016 | Jones et al. | |
| 2009/0167431 A1 * | 7/2009 | Guilherme | H03F 3/2173 330/10 |

* cited by examiner

*Primary Examiner* — Henry Choe (57) ABSTRACT

An audio amplifier with duty ratio control is provided. The audio amplifier comprises a pulse width modulation modulator, a power stage, and a voltage converter. The pulse width modulation modulator is configured to receive an input signal for generating a pulse width modulation signal. The power stage is configured to output an output signal according to a supply voltage and the pulse width modulation signal. The voltage converter is configured to adjust voltage level of the supply voltage according to the pulse width modulation signal. The audio amplifier is configured to adjust the voltage level of the supply voltage when duty ratio of the pulse width modulation signal is greater than a duty ratio threshold.

12 Claims, 11 Drawing Sheets

AUDIO AMPLIFIER WITH DUTY RATIO CONTROL

BACKGROUND OF THE INVENTION

1. Field of the Invention

The present disclosure relates to audio amplifiers, and in particular to an audio amplifier that adaptively adjusts the supply voltage PVDD to make the audio amplifier operate at an optimal operating point.

2. Description of the Related Art

Audio amplifiers are useful in electronic circuits that are used to reproduce input audio signals at sound voice output, so the amplifier must have volume level control, lower harmonic distortion, and higher efficiency performance. Beside, Class D is currently the optimal solution for better possible efficiency, low-cost, and light weight than other classes. Usually, pulse width modulation is applied to control the output devices tightly at Class-D amplifier system.

For improved efficiency concepts, Class-H amplifier is variations upon the theme of Class A/B, which works on power supply voltage section. The Class-H amplifier system utilizes a lower rail voltage, significantly reducing power consumption at low-power conditions, and the system dynamically controls rail voltage to driver high amplitude transients as high-power conditions.

Figure 1A:
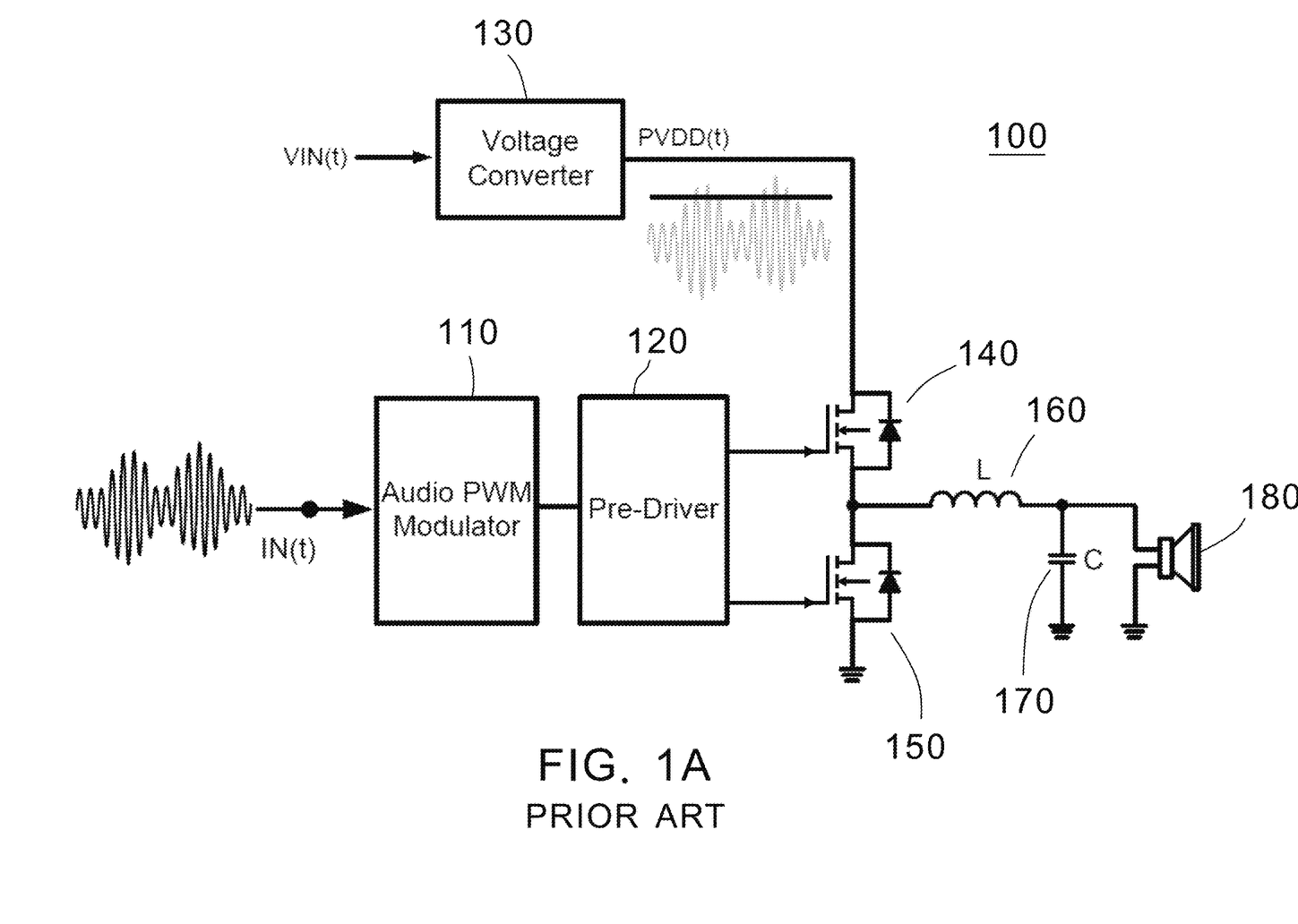
FIG. 1A (Prior Art) is a drawing illustrating a conventional Class-D amplifier circuit with boost converter and without a Class-H amplifier.

Refer to FIG. 1A, which is a drawing illustrating a conventional Class-D amplifier circuit. As shown in FIG. 1A, the conventional Class-D amplifier 100 comprises an audio pulse width modulation (PWM) modulator 110, a pre-driver 120, and a voltage converter 130.

The audio pulse width modulation (PWM) modulator 110 receives an audio signal (IN) at its input. The output of the audio pulse width modulation (PWM) modulator 110 is electrically connected to the input of the pre-driver 120. The pre-driver 120 amplifies the audio signal and outputs the amplified audio signal to a pair of power switches 140, 150.

The voltage converter 130 receives an input voltage VIN and outputs a fixed supply voltage PVDD. The output is connected to an upper power switch 140.

One end of an inductor (L) 160 is connected between the upper power switch 140 and the lower power switch 150. The other end of the inductor 160 is connected to a speaker 180 to allow the audio to be output by the speaker. A capacitor 170 is connected in parallel with the speaker.

Figure 1B:
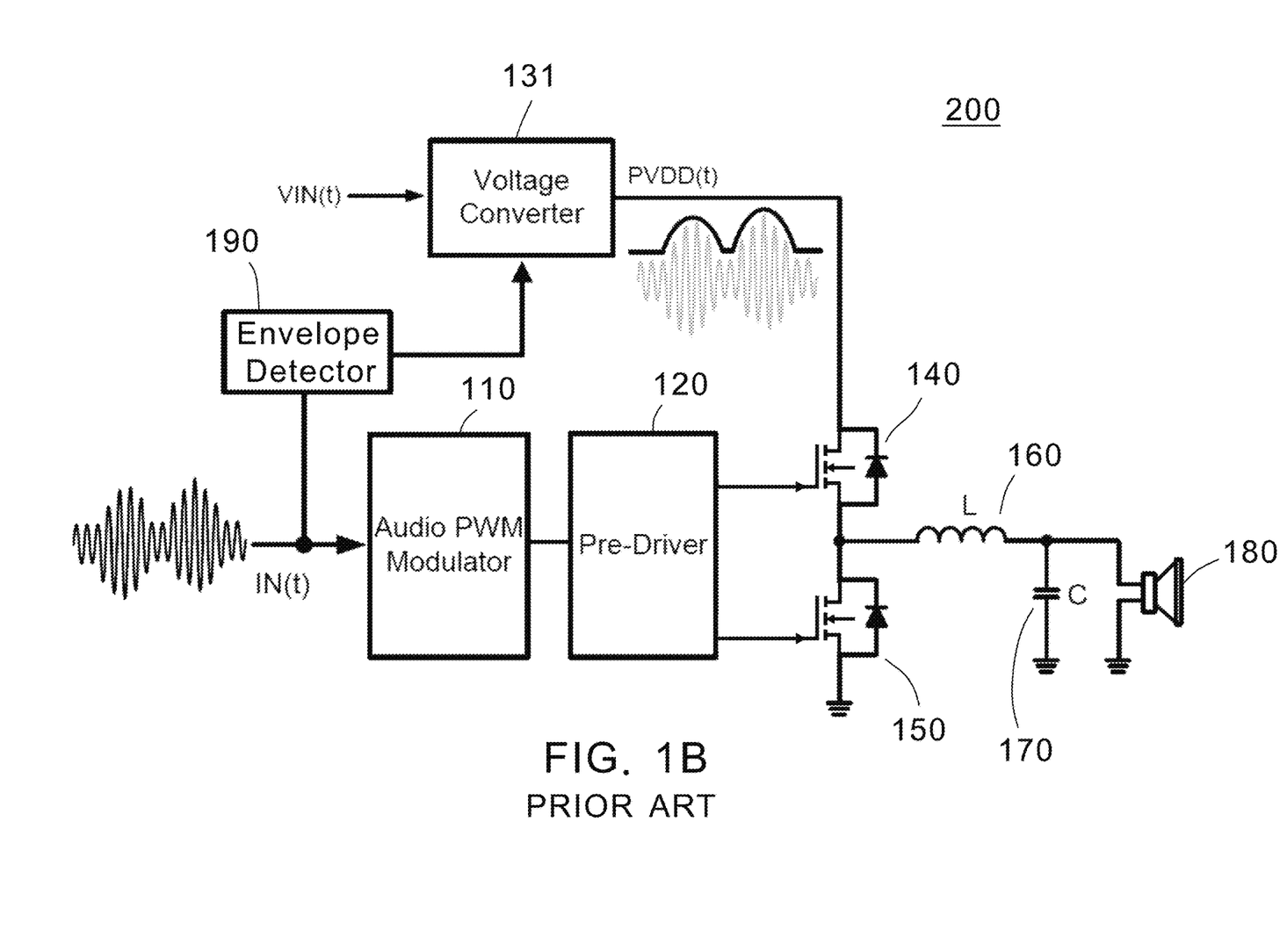
FIG. 1B (Prior Art) is a drawing illustrating a conventional Class-D amplifier circuit with boost converter and with a Class-H amplifier.

Refer to FIG. 1B, which is a drawing illustrating a standalone Class-H amplifier circuit based on a conventional Class-D amplifier.

Some of the components of the Class-H amplifier circuit 200 illustrated in FIG. 1B are the same as the components illustrated in FIG. 1A. The Class-H amplifier circuit 200 differs from the Class-D amplifier circuit 100 in that in FIG. 1B, the audio signal (IN) is fed to a voltage converter 131 by an envelope detector 190 so that the envelope of the audio signal can be tracked. In addition, the voltage converter 131 is configured to output a supply voltage PVDD variably according to an output of the envelope detector 190.

Figure 1C:
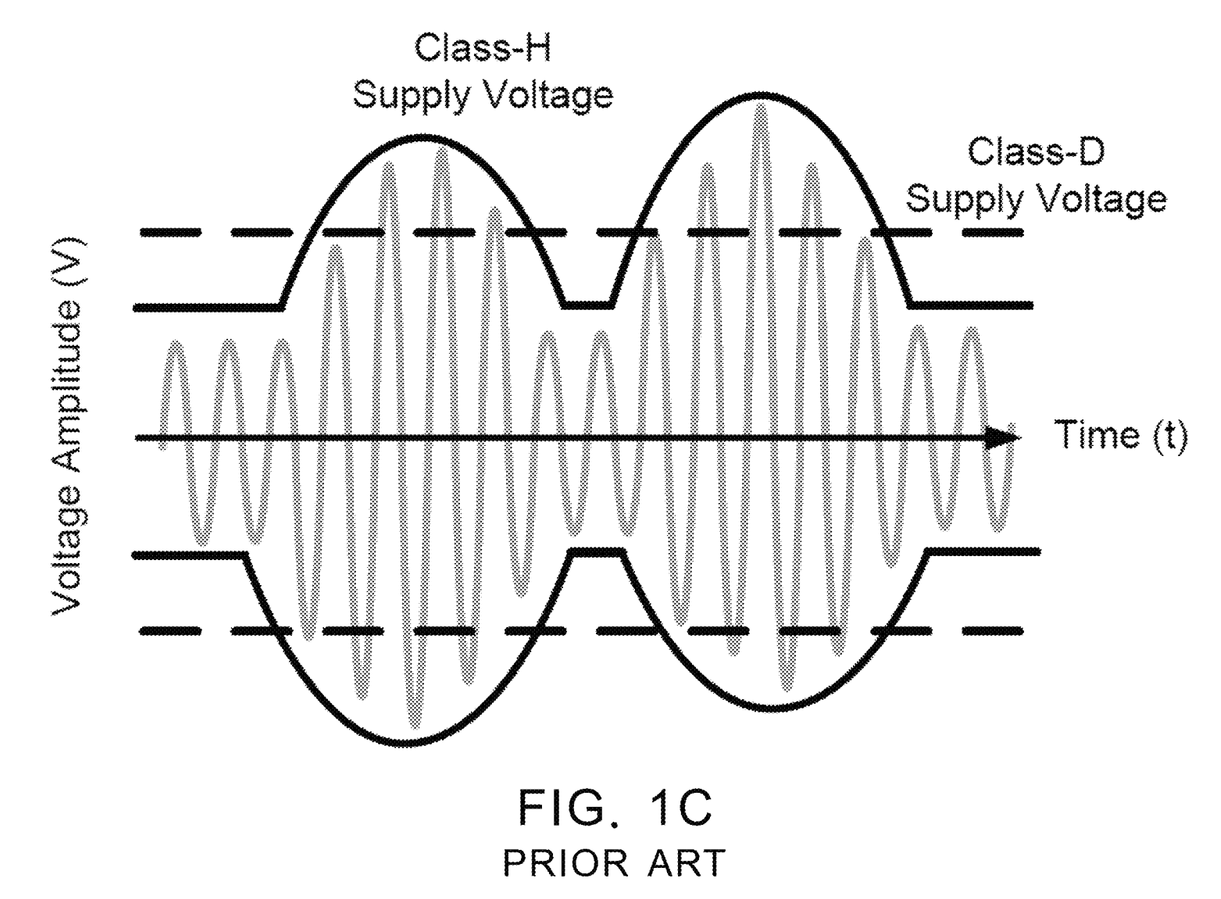
FIG. 1C (Prior Art) is a drawing illustrating the power VDD (PVDD) signals of the circuits of FIG. 1A and FIG. 1B and the audio signal (IN).

Refer to FIG. 1C, which illustrates the signals of supply voltages PVDD of the circuits of FIG. 1A and FIG. 1B and the audio signal.

As shown in FIG. 1C, the supply voltage PVDD of Class-D is a fixed voltage, represented by dashed lines.

In contrast, the supply voltage PVDD, represented by solid curved lines, of the Class-H amplifier is a voltage that tracks the envelope of the audio signal (IN), represented by a gray curve.

Figure 2:
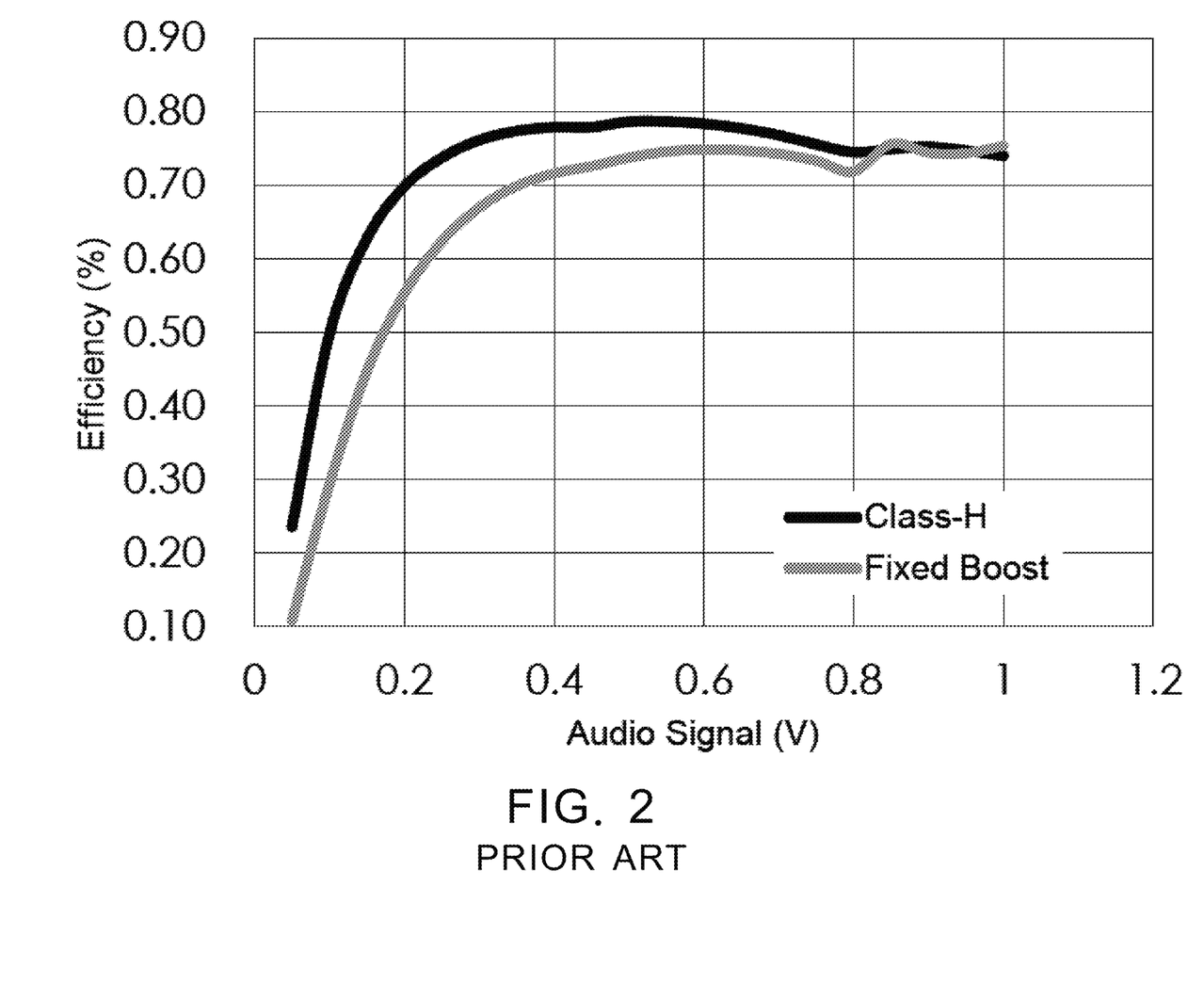
FIG. 2 (Prior Art) is a graph illustrating an efficiency comparison of a Class-H amplifier versus a Class-D amplifier.

Refer to FIG. 2, which is a graph illustrating an efficiency comparison of a Class-H amplifier versus a Class-D amplifier in an example.

As shown in FIG. 2, the Class-H amplifier improves the power conversion efficiency about 15% in this example over the Class-D amplifier designed around a fixed voltage. Accordingly, Class-H amplifier technology is an excellent design choice for the applications with battery voltage limitations. The Class-H amplifier utilizes typical audio tracking to adjust the supply voltage PVDD that can reduce the power switching loss caused by higher cross-voltage and improve the power conversion efficiency as compared with the Class-D amplifier.

As such, in FIG. 1B, the amplifier circuit 200 has multiple-level switchable or variable supply voltage PVDD, as compared to a fixed supply voltage used in FIG. 1A. The Class-H amplifier has high power efficiency over the Class-D amplifier.

BRIEF SUMMARY OF THE INVENTION

An objective of the present disclosure is to provide an audio amplifier with duty cycle control. The audio amplifier can be implemented based on a Class-H configuration with a closed loop control for adjusting a supply voltage for the audio amplifier according to a pulse width modulation signal of the audio amplifier. The audio amplifier is capable of operating at an optimal operating point and controlling the duty cycle of the pulse width modulation signal.

According to embodiments of the invention, an audio amplifier with duty ratio control is provided. The audio amplifier comprises a pulse width modulation modulator, a power stage, and a voltage converter. The pulse width modulation modulator is configured to receive an input signal for generating a pulse width modulation signal. The power stage is configured to output an output signal according to a supply voltage and the pulse width modulation signal. The voltage converter is configured to adjust voltage level of the supply voltage according to the pulse width modulation signal. The audio amplifier is configured to adjust the voltage level of the supply voltage when duty ratio of the pulse width modulation signal is greater than a duty ratio threshold.

According to embodiments of the invention, an audio amplifier with duty ratio control is provided. An audio amplifier with duty ratio control comprises a pulse width modulation modulator, a power stage, and a voltage converter. The pulse width modulation modulator is for generating a pulse width modulation signal. The power stage is coupled to the pulse width modulation modulator. The voltage converter is coupled to the power stage and configured to output a supply voltage to the power stage, wherein the voltage converter is configured to adjust a voltage level of the supply voltage according to duty ratio of the pulse width modulation signal.

In some embodiments of the audio amplifier, the audio amplifier further comprises a pulse width modulation detector which is electrically coupled between the power stage and the voltage converter and is for outputting an indication signal to the voltage converter, wherein the indication signal indicates whether the duty ratio of the pulse width modulation signal is greater than the duty ratio threshold and the voltage converter is configured to adjust the voltage level of the supply voltage according to the indication signal.

In some embodiments of the audio amplifier, the pulse width modulation detector is configured to output the indication signal according to the pulse width modulation signal and the duty ratio threshold.

In some embodiments of the audio amplifier, the voltage converter is configured to adjust the voltage level of the supply voltage when the indication signal indicates that the duty ratio of the pulse width modulation signal is greater than the duty ratio threshold.

In some embodiments of the audio amplifier, the audio amplifier is configured to limit the duty ratio of the pulse width modulation signal to a percentage based on the duty ratio threshold.

In some embodiments of the audio amplifier, a closed loop is formed between the power stage and the voltage converter.

DETAILED DESCRIPTION OF THE INVENTION

To facilitate understanding of the object, characteristics and effects of this present disclosure, embodiments together with the attached drawings for the detailed description of the present disclosure are provided.

The supply voltage PVDD adjustment (rising/falling slope, gain) of a Class-H amplifier is critical to total harmonic distortion (THD) and power conversion efficiency. Capturing the pulse width modulation (PWM) signal of a Class-D amplifier for voltage modulation allows the supply voltage PVDD to be adaptively adjusted to make the audio amplifier operate at an optimal point.

Figure 3:
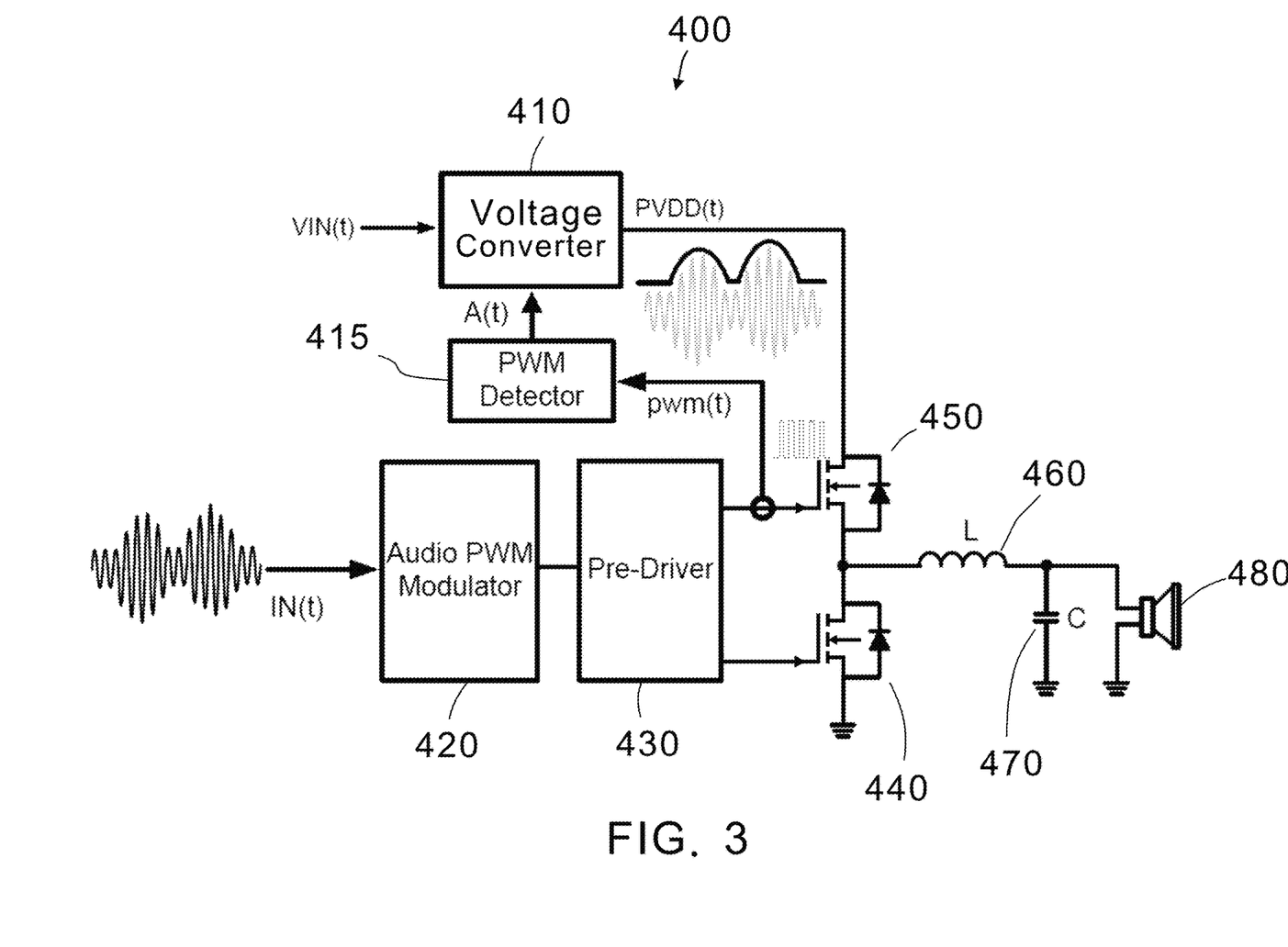
FIG. 3 is a drawing illustrating a closed loop control Class-H audio amplifier according to an embodiment of the present invention.

Refer to FIG. 3, which is a drawing illustrating a closed loop control Class-H audio amplifier according to an embodiment of the present invention.

As shown in FIG. 3, the closed loop control Class-H audio amplifier 400 comprises an audio pulse width modulation (PWM) modulator 420 and a pre-driver 430 that cooperate form the basis for a Class-D amplifier. The audio pulse width modulation (PWM) modulator 420 receives an input signal such as an audio signal (IN). The audio pulse width modulation (PWM) modulator 420 converts the audio signal (IN) into a pulse width modulation signal. The pulse width modulation (PWM) signal is output by the audio pulse width modulation (PWM) modulator 420 and input into the pre-driver 430. The pre-driver 430 amplifies the pulse width modulation (PWM) signal and outputs the amplified pulse width modulation (PWM) signal to a power stage. The power stage comprises a first switch 450 and a second switch 440. The pre-driver 430 comprises two outputs. One output of the pre-driver 430 is electrically connected to the first switch 450 and the other output of the pre-driver 430 is electrically connected to the second switch 440. For example, the audio pulse width modulation (PWM) modulator 420 and the pre-driver 430 can be implemented based on using a comparator to compare the input signal with a triangular wave. A low pass filter comprising an inductor 460 and a capacitor 470 has one end of the inductor 460 electrically connected between the first switch 450 and the second switch 440. A speaker 480 is connected in parallel with the capacitor 470 of the low pass filter.

One end of the first switch 450 is connected to the output of a voltage converter 410. The voltage converter 410 receives an input voltage VIN and outputs a supply voltage PVDD according to a control signal. For example, the voltage converter 410 can be implemented by using a step-up converter, a step-down converter, or a low dropout regulator, which can output a supply voltage variably according to a control signal. The control signal can be obtained, for example, according to the pulse width modulation signal.

The closed loop control Class-H audio amplifier 400 further comprises a PWM detector 415. An input to the PWM detector 415 is electrically connected to the output of the pre-driver 430 that is electrically connected to the first switch 450. The output of the PWM detector 415 is connected to a feedback input of the voltage converter 410.

As shown in FIG. 3, a closed loop is formed between the output of the voltage converter 410, through the first switch 450, into the input of the PWM detector 415, and into the feedback input of the voltage converter 410.

The PWM detector 415 senses the duty ratio of the pulse width modulation (PWM) signal at the input to the PWM detector 415. By using the PWM detector 415, the percentage of the duty ratio of the pulse width modulation (PWM) signal can be limited based on a duty ratio threshold. Since a louder audio volume has a larger duty ratio, the pulse width modulation (PWM) signal can be limited to ensure that the audio signal does not clip or distort.

In an embodiment of the present invention, the duty ratio threshold is preset in hardware or firmware.

In an embodiment of the present invention, the duty ratio threshold is controllable or variable by a user of the hardware or firmware.

The PWM detector 415 outputs a feedback control signal to the feedback input of the voltage converter 410. The received feedback control signal is utilized by the voltage converter 410 to continually or adaptively adjust the supply voltage. In this way, the adaptively adjusted supply voltage PVDD ensures that the audio amplifier operates at the optimal point.

Figure 4:
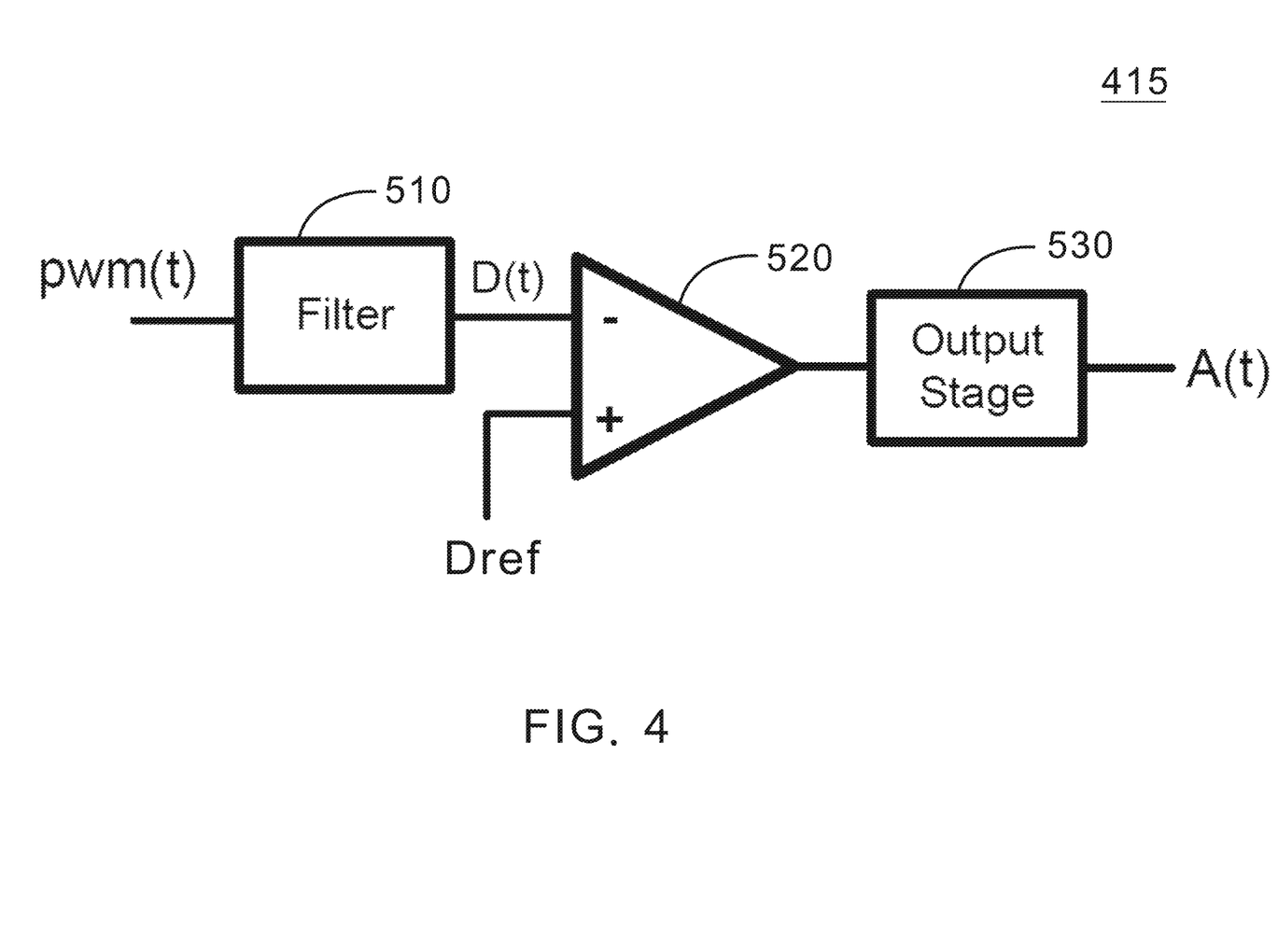
FIG. 4 is a schematic diagram illustrating a pulse width modulation detector according to an embodiment of the present invention.

Referring to FIG. 4, an embodiment of the PWM detector 415 is illustrated. In FIG. 4, an embodiment of the PWM detector 415 includes a filter 510, an error amplifier 520, and an output stage 530. The filter 510 receives the pulse width modulation signal (e.g., indicated by pwm(t)) and outputs a filtered signal indicating a duty ratio D(t) of the pulse width modulation signal. The error amplifier 520 compares the filtered signal indicating the duty ratio D(t) with a duty ratio reference Dref. The output stage 530 outputs an indication signal A(t) according to the output of the error amplifier 520. When the duty ratio D(t) is equal to or greater than the duty ratio reference Dref, the error amplifier 520 outputs an output through the output stage 530, so that the PWM detector 415 outputs the indication signal A(t) indicating that the duty ratio of the pulse width modulation signal is going to be equal to or greater than the duty ratio reference Dref.

Figure 5:
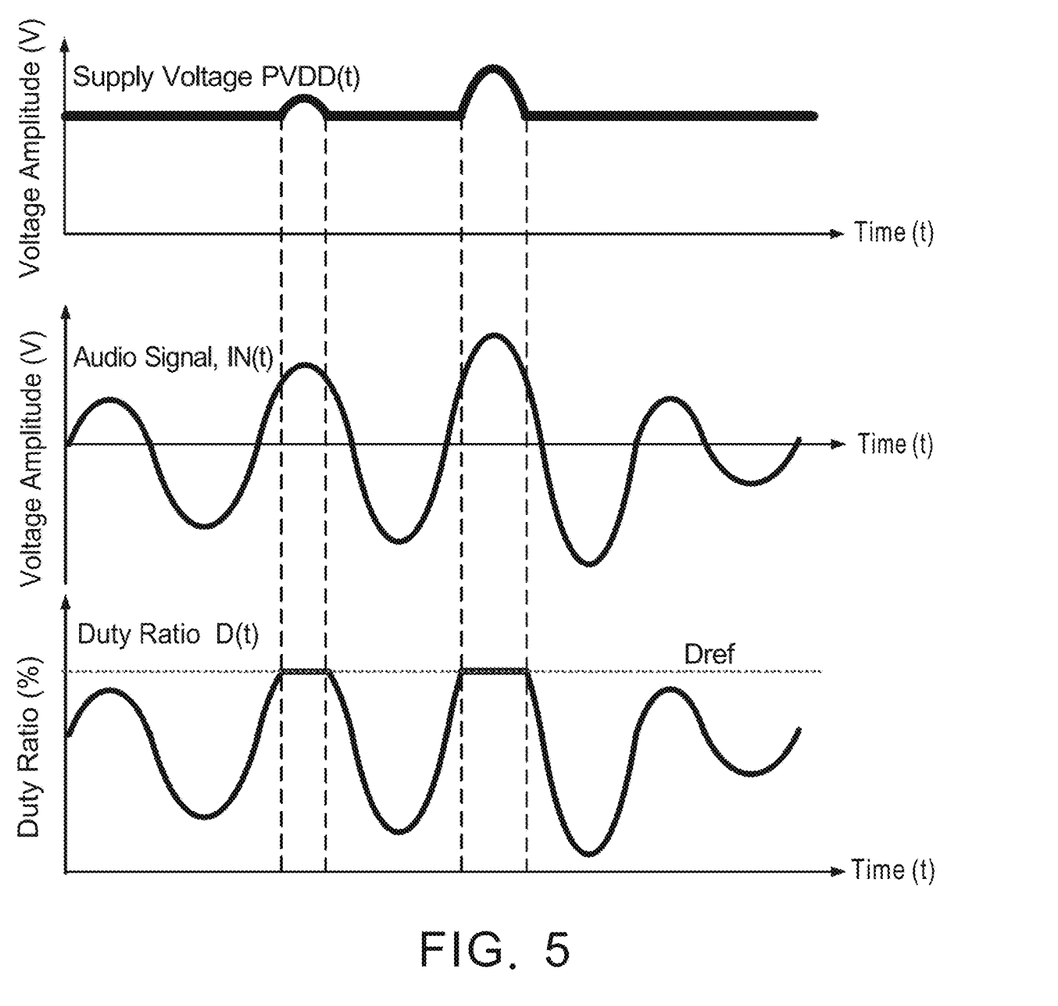
FIG. 5 illustrates waveforms of the circuit of FIG. 5 with pulse width modulation (PWM) control according to an embodiment of the present invention.

Refer to FIG. 5, which illustrates waveforms of the circuit of FIG. 4 with pulse width modulation (PWM) control according to an embodiment of the present invention.

Referring to FIG. 5, when the audio signal IN(t) is internally modulated, the duty ratio D(t) of the PWM signal varies. When the duty ratio D(t) is equal to or going to be greater than the duty ratio reference Dref, the voltage converter 410 adjusts the voltage level of the supply voltage PVDD(t) according to the indication signal A(t) output by the PWM detector 415. For example, the voltage converter 410 increases the voltage level of the supply voltage PVDD (t). The audio amplifier 400 has the characteristic that when the voltage level of the supply voltage PVDD(t) is increased, the duty ratio of the PWM signal is reduced. By way of the characteristic, the duty ratio of the PWM signal is controlled, such as to be locked at the duty ratio reference Dref. As a result, the circuit of the embodiment operates at an optimal operating point to obtain the optimal system efficiency.

Also, as shown in FIG. 5, the duty ratio of the PWM signal is limited to a duty ratio threshold, such as the duty ratio reference Dref which corresponds to a percentage of duty ratio (e.g., 80%, 85%, or any suitable value). When the duty ratio of the PWM signal is less than the duty ratio threshold, the PWM signal varies according to the audio signal IN(t) and the supply voltage PVDD(t) remains at a specific voltage level. When the duty ratio of the PWM signal is equal to or is going to be greater than the duty ratio threshold, the duty ratio of the PWM signal is reduced while the supply voltage PVDD(t) is increased by way of the characteristic of the audio amplifier 400. In this manner, the duty ratio of the PWM signal is limited to the duty ratio threshold as a whole.

In some embodiments, the voltage converter can be implemented so that the duty ratio threshold can be controllable or variable by way of hardware, firmware or software implementation.

In some embodiments, the PWM detector 415 can be implemented by or based on a frequency-locked loop or feedback control module.

Figure 6:
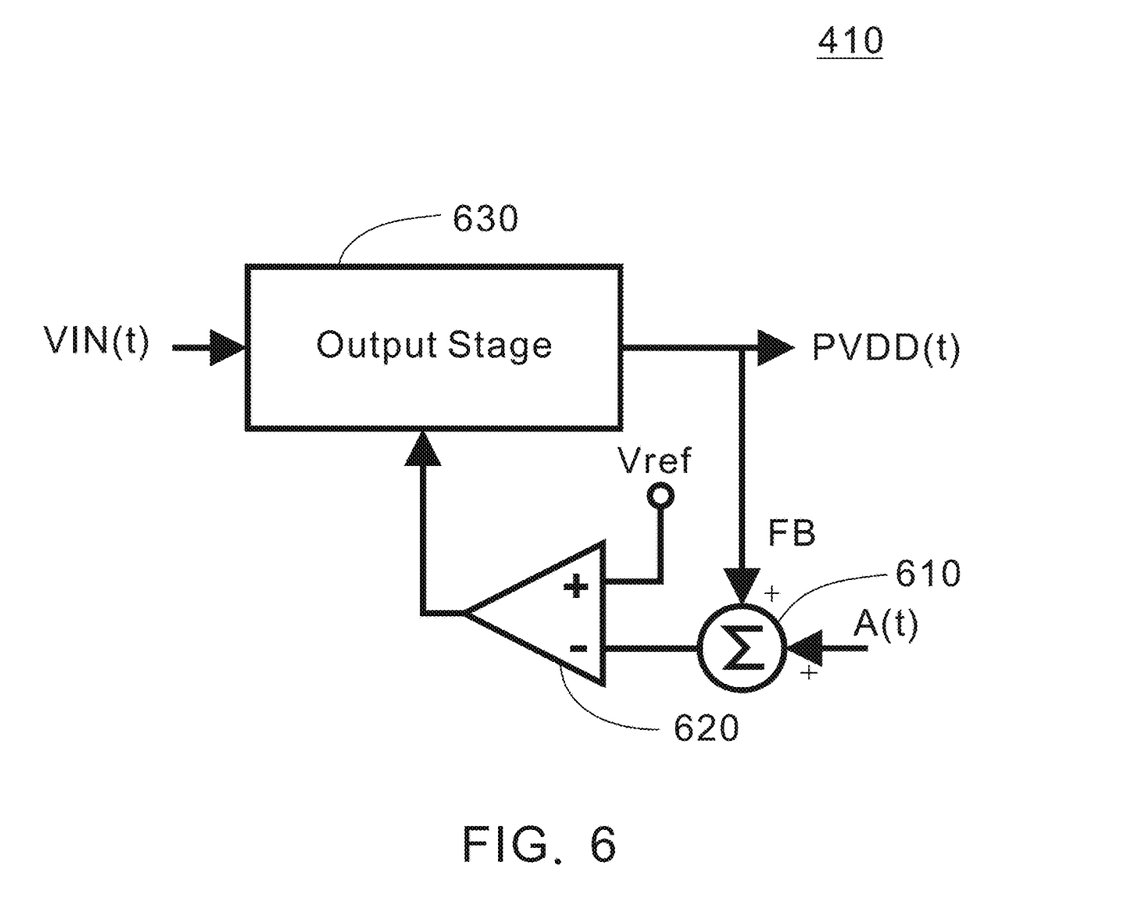
FIG. 6 a schematic diagram illustrating a voltage converter according to an embodiment of the present invention.

Refer to FIG. 6, which is a schematic diagram illustrating a voltage converter according to an embodiment of the present invention. In the embodiment in FIG. 6, the voltage converter 410 can be implemented to include a summation circuit 610 (e.g., indicated by a sigma sign (Σ)), an error amplifier 620, and an output stage 630. The summation circuit 610 outputs a summation signal according to the indication signal A(t) from the PWM detector 415 and a feedback signal FB of the voltage converter 410 (e.g., the supply voltage PVDD(t)). The error amplifier 620 outputs a comparison signal according to the summation signal and a reference signal (indicated by Vref). The output stage 630 outputs the supply voltage PVDD(t) according to the input voltage VIN(t) and the comparison signal. For example, the input voltage VIN(t) is a DC voltage signal and the output stage 630 of the voltage converter 410 adjusts the supply voltage PVDD(t) in response to the comparison signal.

Figure 7A:
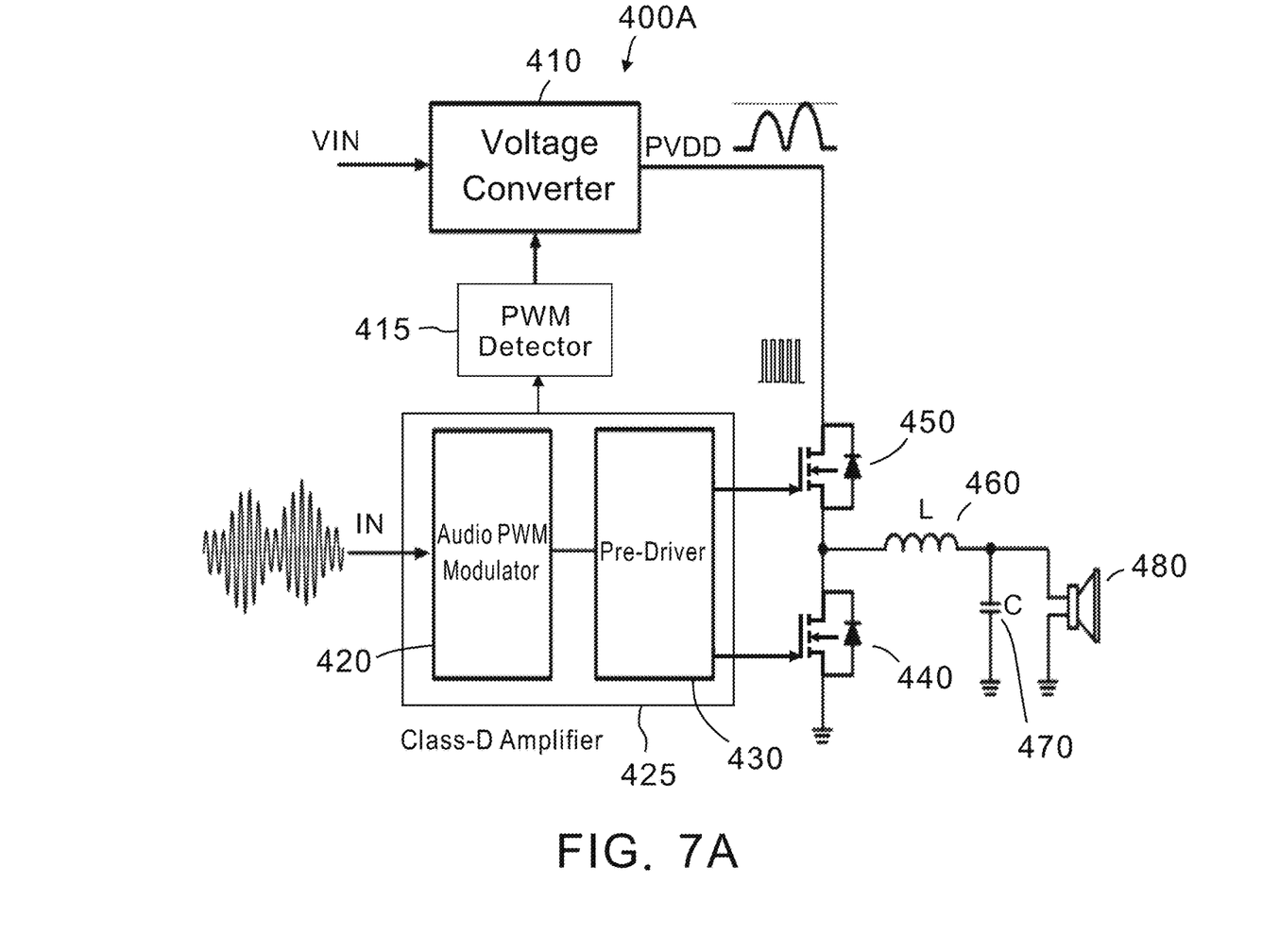
FIG. 7A is a drawing illustrating a closed loop control Class-H audio amplifier according to an embodiment of the present invention.
Figure 7B:
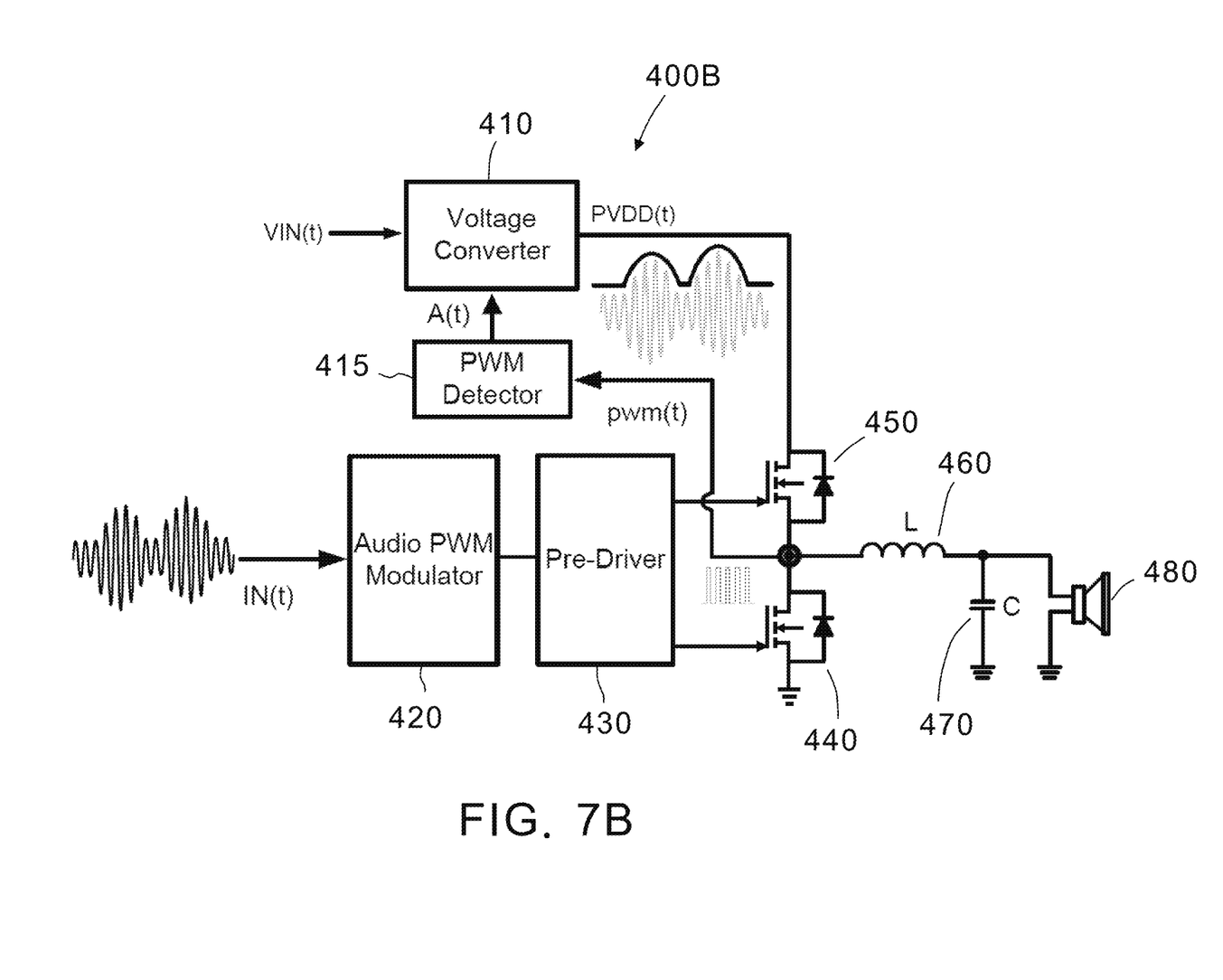
FIG. 7B is a drawing illustrating a closed loop control Class-H audio amplifier according to an embodiment of the present invention.
Figure 7C:
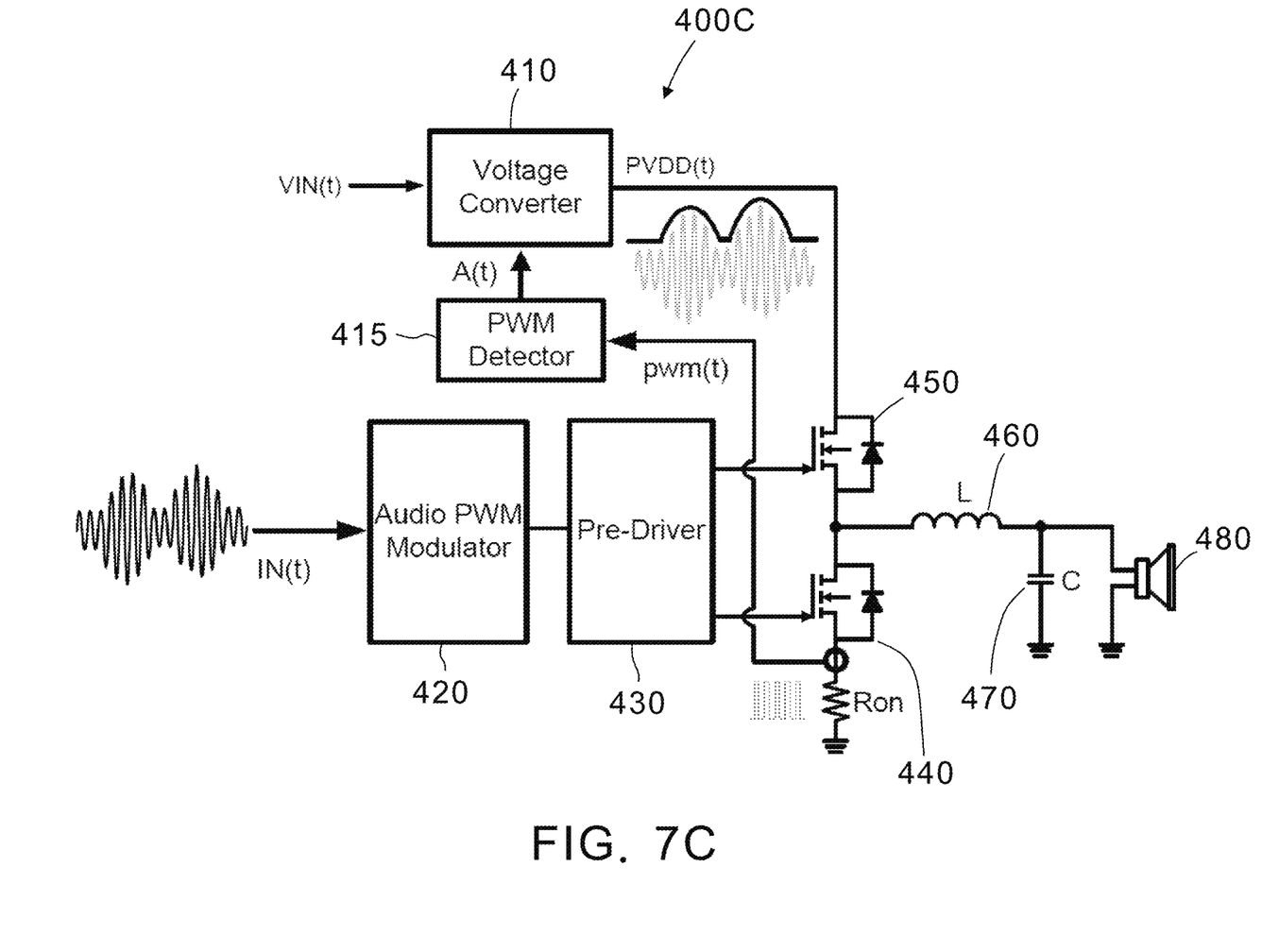
FIG. 7C is a drawing illustrating a closed loop control Class-H audio amplifier according to an embodiment of the present invention.

Refer to FIGS. 7A, 7B, and 7C, which are drawings illustrating closed loop control Class-H audio amplifiers (e.g., 400A, 400B, 440C) according to embodiments of the present invention.

The closed loop control Class-H audio amplifiers illustrated in FIGS. 7A, 7B, and 7C operate similarly to the closed loop control Class-H audio amplifier illustrated in FIG. 3.

However, in these embodiments the inputs to the PWM detector 415 are electrically connected to alternative nodes in the circuit. For example, in FIG. 7B, the input to the PWM detector 415 is electrically connected to a node connected to the load inductor L 460. In FIG. 7C, the input to the PWM detector 415 is electrically connected at a node between a resistor Ron and the second switch 440. In the embodiment of FIG. 7A, the input to the PWM detector 415 is electrically connected to a feedback output of the Class-D amplifier 425 and not connected between the pre-driver 430 and the first switch 450.

In the embodiments illustrated in FIGS. 7A, 7B, and 7C, the Class-D amplifier 425 is formed by a combination of the audio pulse width modulation (PWM) modulator 420 and the pre-driver 430.

According to some embodiments of the invention, an audio amplifier with duty ratio control is provided. The audio amplifier (e.g., 400, 400A, 400B, or 400C in FIG. 3, 7A, 7B, or 7C) comprises a pulse width modulation modulator (e.g., 420 in FIG. 3, 7A, 7B, or 7C), a power stage (e.g., 440 and 450 in FIG. 3, 7A, 7B, or 7C; or 430, 440 and 450 in FIG. 3, 7A, 7B, or 7C), and a voltage converter (e.g., 410 in FIG. 3, 7A, 7B, or 7C). The pulse width modulation modulator is configured to receive an input signal for generating a pulse width modulation signal. The power stage is configured to output an output signal according to a supply voltage and the pulse width modulation signal. The voltage converter is configured to adjust voltage level of the supply voltage according to the pulse width modulation signal. The audio amplifier is configured to adjust the voltage level of the supply voltage when duty ratio of the pulse width modulation signal is greater than a duty ratio threshold.

According to other embodiments of the invention, an audio amplifier with duty ratio control is provided. The audio amplifier (e.g., 400, 400A, 400B, or 400C in FIG. 3, 7A, 7B, or 7C) comprises a pulse width modulation modulator (e.g., 420 in FIG. 3, 7A, 7B, or 7C), a power stage (e.g., 440 and 450 in FIG. 3, 7A, 7B, or 7C; or 430, 440 and 450 in FIG. 3, 7A, 7B, or 7C), and a voltage converter (e.g., 410 in FIG. 3, 7A, 7B, or 7C). The pulse width modulation modulator is for generating a pulse width modulation signal. The power stage is coupled to the pulse width modulation modulator. The voltage converter is coupled to the power stage and configured to output a supply voltage to the power stage, wherein the voltage converter is configured to adjust a voltage level of the supply voltage according to duty ratio of the pulse width modulation signal.

In some embodiments of the audio amplifier, the audio amplifier further comprises a pulse width modulation detector (e.g., 415 in FIG. 3, 7A, 7B, or 7C) which is electrically coupled between the power stage and the voltage converter and is for outputting an indication signal (e.g., A(t) in FIG. 3, 7A, 7B, or 7C) to the voltage converter, wherein the indication signal indicates whether the duty ratio of the pulse width modulation signal is greater than the duty ratio threshold and the voltage converter is configured to adjust the voltage level of the supply voltage according to the indication signal.

In some embodiments of the audio amplifier, the pulse width modulation detector is configured to output the indication signal (e.g., A(t) in FIG. 3, 7A, 7B, or 7C) according to the pulse width modulation signal (e.g., pwm(t)) and the duty ratio threshold (e.g., Dref), for example, as shown in FIG. 4.

In some embodiments of the audio amplifier, the voltage converter is configured to adjust the voltage level of the supply voltage when the indication signal (e.g., A(t) in FIG. 3, 7A, 7B, or 7C) indicates that the duty ratio of the pulse width modulation signal is greater than the duty ratio threshold.

In some embodiments of the audio amplifier, the audio amplifier is configured to limit the duty ratio of the pulse width modulation signal to a percentage based on the duty ratio threshold (e.g., as shown in FIG. 5).

In some embodiments of the audio amplifier, a closed loop is formed between the power stage and the voltage converter (e.g., as illustrated in FIG. 3, 7A, 7B, or 7C).

While the present disclosure has been described by means of specific embodiments, numerous modifications and variations could be made thereto by those skilled in the art without departing from the scope and spirit of the present disclosure set forth in the claims.

What is claimed is:

1. An audio amplifier with duty ratio control, comprising:
   a pulse width modulation modulator configured to receive an input signal for generating a pulse width modulation signal;
   a power stage configured to output an output signal according to a supply voltage and the pulse width modulation signal; and
   a voltage converter configured to adjust voltage level of the supply voltage according to the pulse width modulation signal;
   wherein the audio amplifier is configured to adjust the voltage level of the supply voltage when duty ratio of the pulse width modulation signal is greater than a duty ratio threshold.

2. The audio amplifier according to claim 1, further comprising:
   a pulse width modulation detector, electrically coupled between the power stage and the voltage converter, for outputting an indication signal to the voltage converter, wherein the indication signal indicates whether the duty ratio of the pulse width modulation signal is greater than the duty ratio threshold and the voltage converter is configured to adjust the voltage level of the supply voltage according to the indication signal.

3. The audio amplifier according to claim 2, wherein the pulse width modulation detector is configured to output the indication signal according to the pulse width modulation signal and the duty ratio threshold.

4. The audio amplifier according to claim 2, wherein the voltage converter is configured to adjust the voltage level of the supply voltage when the indication signal indicates that the duty ratio of the pulse width modulation signal is greater than the duty ratio threshold.

5. The audio amplifier according to claim 1, wherein the audio amplifier is configured to limit the duty ratio of the pulse width modulation signal to a percentage based on the duty ratio threshold.

6. The audio amplifier of claim 1, wherein a closed loop is formed between the power stage and the voltage converter.

7. An audio amplifier with duty ratio control, comprising:
   a pulse width modulation modulator for generating a pulse width modulation signal;
   a power stage coupled to the pulse width modulation modulator; and
   a voltage converter coupled to the power stage and configured to output a supply voltage to the power stage, wherein the voltage converter is configured to adjust a voltage level of the supply voltage according to duty ratio of the pulse width modulation signal.

8. The audio amplifier according to claim 7, further comprising:
   a pulse width modulation detector, electrically coupled between the power stage and the voltage converter, for outputting an indication signal to the voltage converter, wherein the indication signal indicates whether the duty ratio of the pulse width modulation signal is greater than a duty ratio threshold and the voltage converter adjusts the voltage level of the supply voltage according to the indication signal.

9. The audio amplifier according to claim 8, wherein the pulse width modulation detector is configured to output the indication signal according to the pulse width modulation signal and the duty ratio threshold.

10. The audio amplifier according to claim 8, wherein the voltage converter is configured to adjust the voltage level of the supply voltage when the indication signal indicates that the duty ratio of the pulse width modulation signal is greater than the duty ratio threshold.

11. The audio amplifier according to claim 7, wherein the audio amplifier is configured to limit the duty ratio of the pulse width modulation signal to a percentage based on the duty ratio threshold.

12. The audio amplifier of claim 7, wherein a closed loop is formed between the power stage and the voltage converter.

* * * * *